United States Patent
Volodin et al.

(10) Patent No.: US 9,356,415 B2
(45) Date of Patent: May 31, 2016

(54) HIGH POWER FIBER LASER SAFETY CONTROL SYSTEM

(71) Applicant: IPG PHOTONICS CORPORATION, Oxford, MA (US)

(72) Inventors: Valentyn Volodin, Burbach (DE); Sergey Guskov, Burbach (DE)

(73) Assignee: IPG PHOTONICS CORPORATION, Oxford, MA (US)

( * ) Notice: Subject to any disclaimer, the term of this patent is extended or adjusted under 35 U.S.C. 154(b) by 0 days.

(21) Appl. No.: 14/638,721

(22) Filed: Mar. 4, 2015

(65) Prior Publication Data

US 2015/0255943 A1    Sep. 10, 2015

Related U.S. Application Data

(60) Provisional application No. 61/947,581, filed on Mar. 4, 2014.

(51) Int. Cl.
| | |
|---|---|
| *H01S 3/067* | (2006.01) |
| *H01S 3/091* | (2006.01) |
| *H01S 5/42* | (2006.01) |
| *H01S 3/094* | (2006.01) |
| *H01S 5/40* | (2006.01) |

(52) U.S. Cl.
CPC .............. *H01S 3/067* (2013.01); *H01S 3/0912* (2013.01); *H01S 3/094003* (2013.01); *H01S 3/094076* (2013.01); *H01S 5/42* (2013.01); *H01S 3/094042* (2013.01); *H01S 5/4025* (2013.01)

(58) Field of Classification Search
CPC ........................ H01S 3/0912; H01S 3/094042
See application file for complete search history.

(56) References Cited

U.S. PATENT DOCUMENTS

| | | | | |
|---|---|---|---|---|
| 2004/0208650 | A1* | 10/2004 | Suzuki | 398/195 |
| 2005/0018715 | A1* | 1/2005 | Varshneya et al. | 372/6 |
| 2009/0128347 | A1* | 5/2009 | Bucella et al. | 340/654 |
| 2012/0321337 | A1* | 12/2012 | Uezono | 399/88 |

* cited by examiner

*Primary Examiner* — Tod T Van Roy
(74) *Attorney, Agent, or Firm* — Yuri Kateshov, Esq.; Timothy J. King, Esq.

(57) ABSTRACT

A laser safety control system is configured with a power source module directly coupled to an AC source and including a galvanically isolated DC/DC converter with at least one output capacitor, and a safety mechanism. The safety mechanism has first and second safety channels which operate independently from one another so as to switch the normal operating regime of the power source module to the safe regime. In the normal operating regime, its DC output has a high voltage, whereas in the safe regime the DC output has a low voltage lower than the high voltage.
The safety channels each include a shutdown circuit operative to switch the DC/DC converter off and a discharging circuit operative to discharge the output capacitor. The switching off DC/DC converter and discharging of the output capacitor define the safe regime of the power source module.

6 Claims, 3 Drawing Sheets

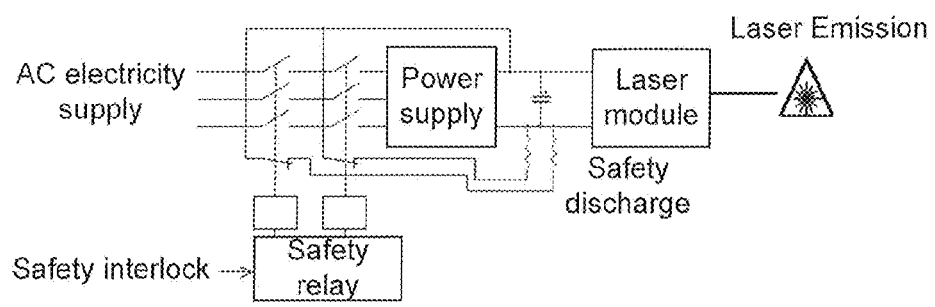
FIG. 1
Prior art
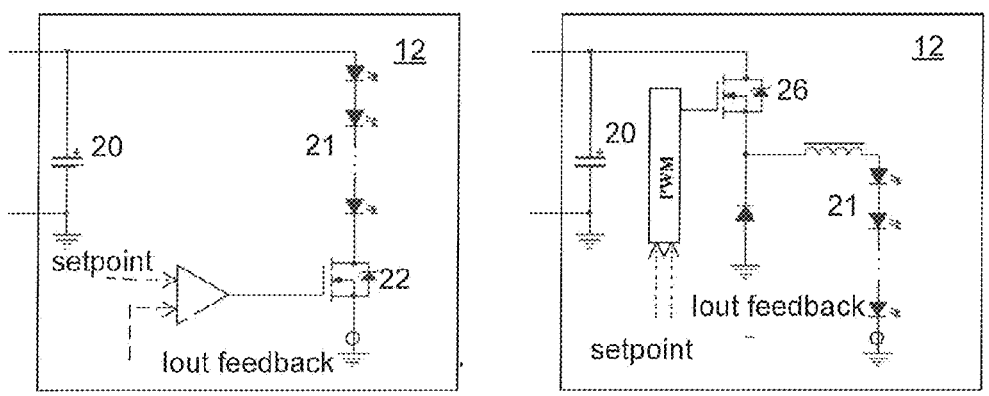
FIG. 2
FIG. 3

HIGH POWER FIBER LASER SAFETY CONTROL SYSTEM

BACKGROUND OF THE INVENTION

1. Field of the Disclosure

This invention relates to the field of laser safety systems and, in particular, a method is described for electronically bringing a high power fiber laser to a safe state by means of functions which are integrated into the power source of the laser.

2. Prior Art

High power lasers with semiconductor pumping, for example fiber lasers, are widely used for processing various materials. Powerful laser radiation is hazardous for humans when various human organs, especially the eyes, are directly exposed to the laser radiation. Therefore, the system integrators should provide safety measures for protecting the personnel who work in the vicinity of operating high power lasers. These measures are generally related to constructing a closed protective booth around the workpiece to be laser processed. The booth keeps the laser radiation from penetrating beyond its boundaries and may be accessed, for example, to change the workpiece or for other purposes. Clearly, when the booth is accessed, it is necessary to bring the laser to a safe state/regime in which no laser radiation is generated.

Typically, the laser itself is located outside the protective booth with the laser radiation being guided into the booth by a delivery fiber. In the latter configuration, it is necessary to monitor the integrity of the laser itself and that of the delivery fiber in order to bring the laser to the safe regime once a need arises.

The safety measures require that the laser's developer provide the system integrator with the possibility (interface) of bringing the laser to a safe state in which it is not possible to generate laser radiation. The current machine safety standards, such as ISO 13849-1, define safety system categories (Performance Levels) depending on the probability of failure of the safety system in response to a single or multiple faults. The current minimum for the safety systems of powerful lasers is Cat. 3 PLD according to ISO 13849-1 requiring that a single fault of safety system should not lead to the loss of the safety function, and whenever reasonably practical, the single fault shall be detected at or before the next demand upon the safety function is received.

One of the current widespread methods for bringing not only lasers, but also other electrical machines to a safe state includes disconnecting (de-energizing) them from the power grid with the help of two redundant contactors connected in series and controlled with the help of a safety relay which also monitors their status in the work process. An example of this system is shown in FIG. 1. When the contactors are open, the laser is disconnected from an energy source. If there are capacitances in the system capable of storing sufficient energy to generate hazardous radiation, they must be discharged so as to bring the laser to the safe state. The discharge can be forced by means of auxiliary, normally closed contacts of contactors. Such as solution has shortcomings for applications where it is necessary to rapidly and frequently bring the laser to a safe regime, such as on processing conveyor lines, where the processing cycle lasts no longer than several seconds. In this case, the mechanical lifetime of the contactors is exhausted very quickly, which leads to their frequent replacement. Furthermore, every time the contactors are switched to the closed position, a laser system "cold" starts which takes a relatively long time in order to get the system ready for work. This leads to expensive delays in the operation of conveyor lines.

An alternative solution providing the required safety measures includes the installation of a special shutter (optical safety shutter) in the path of the laser radiation. However, in the case of a fiber laser or another type of laser with a radiation delivery fiber, this arrangement inevitably requires that the radiation be emitted from the fiber and subsequently reverse inputted into the fiber, which degrades the quality (brightness) of this radiation and negatively affects the reliability of the entire system. Furthermore, such an arrangement considerably raises the price of the system.

SUMMARY OF THE INVENTION

Within the framework of this invention, a safety system is disclosed which is operative to electronically enable a laser system to switch to a safe regime with the help of a special function integrated into the power source of the laser system. In the disclosed laser system, the safety function is determined as stopping the laser radiation of the system by means of a two-channel (redundant) shutdown of the DC-DC converter of the power source and a two-channel (redundant) discharge of its output capacitors to a safe level within a predetermined time range. The situations requiring the safe regime of the laser system include the following:

removal of permission signals from an external safety interface;

violation of the integrity of the radiation delivery fiber;

violation of the integrity of the laser housing; and actuation of any other safety system sensors, depending on the particular implementation of the laser system.

More specifically, one of the aspects of the invention relates to the inventive laser safety control system which is configured with a power source module directly coupled to an AC source. The power source module includes a galvanically isolated DC/DC converter with an output capacitor, and a safety mechanism.

The safety mechanism is operative to discharge the output capacitor and switch the power source module between normal and safe regimes. The normal regime is characterized by a high voltage DC output of the source, whereas in the safe regime, the DC output is lower than that of the normal regime.

The inventive laser safety system according to this aspect further includes a laser module. The latter is configured with a high power fiber laser system and a laser pump system which receives the DC output. The DC output in the safe regime is lower than an emission threshold of the laser pump system.

In accordance with another aspect, the inventive laser control system is configured with a power source module directly coupled to an AC source. The power source module includes a galvanically isolated DC/DC converter with an output capacitor, and a safety mechanism operative to discharge the output capacitor and controllably operate in safety and normal regimes. The normal regime is characterized by a high voltage DC output of the source, whereas in the safe regime, the DC output is lower than that of the normal regime. The low DC output is selected to be lower than the emission threshold of the pump for high power fiber laser which receives the DC output.

The safety mechanism is configured with first and second safety channels which operate independently from one another and each are configured with:

a shutdown circuit for switching the power source module from the normal operating regime to the safe regime, and a discharging circuit operative to discharge the output capacitor to a voltage below a desired threshold in the safety regime.

In another aspect, the disclosed safety system of either one of the above disclosed aspects also has a safety controller configured to control the operation of the power source in response to alarm signals from respective external and internal safety-related sensors. The safety controller is operative to generate an enabling signal coupled into the safety mechanism so as to enable the power source in the normal operating regime when all of the external and internal sensors do not output respective alarm signals. The safety controller is also operative to terminate the enabling signal in response to the alarm signal of at least one of the internal and external sensors. The safety channels of the safety mechanism each are configured to switch the normal operating regime of the power source module to the safety regime and discharge the output capacitor in the absence of the enabling signal.

Still another aspect of the invention relates to the laser safety system as disclosed in any of the above-discussed aspects which also includes one or more additional power source modules.

In accordance with still another aspect of the invention, the laser safety system of any of the above-disclosed aspects is configured with the safety mechanism in which the discharging circuits of respective safety channels each operate subsequently to or simultaneously with the shutdown circuit.

According to still another aspect of the invention, the safety system as discussed in any of the above referred to aspects is configured with the safety mechanism which includes a plurality of multiple sensors monitoring integrity of executive components. The sensors are integrated in each of the safety channels of the safety mechanism.

In accordance with still another aspect of the invention, the laser safety system of any of the above-disclosed aspects includes the safety channels of the safety mechanism each of which is configured with a plurality of output components. The output components each are operative to provide respective inputs into the safety controller when the power source module is in the safe regime, and the executive components are properly functioning.

In accordance with a further aspect, the safety system of any of the above disclosed aspects includes an auxiliary power source which is coupled to the output capacitor. The auxiliary power source is operative to realize the safety regime if the power supply module is deenergized.

The major advantages of this system are the absence of electromechanical elements subject to wear (contactors), relatively little time required to bring to a state of readiness (less than 100 ms), relatively low cost of implementation, and absence of additional energy losses in the path.

BRIEF DESCRIPTION OF THE DRAWINGS

The above-disclosed features and advantages will become more readily apparent from the following specific description accompanied with the drawings, in which:

FIG. 1 shows one of laser safety systems of the known prior art;

FIG. 2 shows a simplified structure of the pumping module of a fiber laser with linear pump current control element;

FIG. 3 shows a simplified structure of the pumping module with a high-frequency PWM (Pulse width modulation) method for controlling the pumping current (buck stage);

SPECIFIC DESCRIPTION

FIG. 2 illustrates the pumping module of a fiber laser with linear pump current control element 22 which is a MOSFET.

FIG. 3 shows the simplified structure of the pumping module of a fiber laser with a high-frequency PWM (Pulse width modulation) method for controlling the pumping current (buck stage). In contrast to FIG. 2, the control element 26 in FIG. 3 operates in a switch mode at a high frequency (hundreds of kilohertz).

The pumping diodes cannot radiate enough energy to generate a hazardous laser emission level if the voltage applied to these diodes is lower than a certain value which defines the diode generation threshold current. Let us provisionally designate this safe voltage value as 20 volts, while normal operation of the pumping module requires supply voltage on the order of 75 volts. The value 20 V is determined by the total number of pumping diodes 21 connected in series to one circuit and by the forward voltage drop on one diode.

From FIGS. 2 and 3 it is evident that the voltage on the diodes in both cases cannot be higher than the pumping module supply voltage, which means that for achieving a safe state of the laser, it is sufficient to ensure a pumping module supply voltage value or (which is the same thing) a power source output voltage, lower than 20V (Safe output voltage or SOV).

Figure 4:
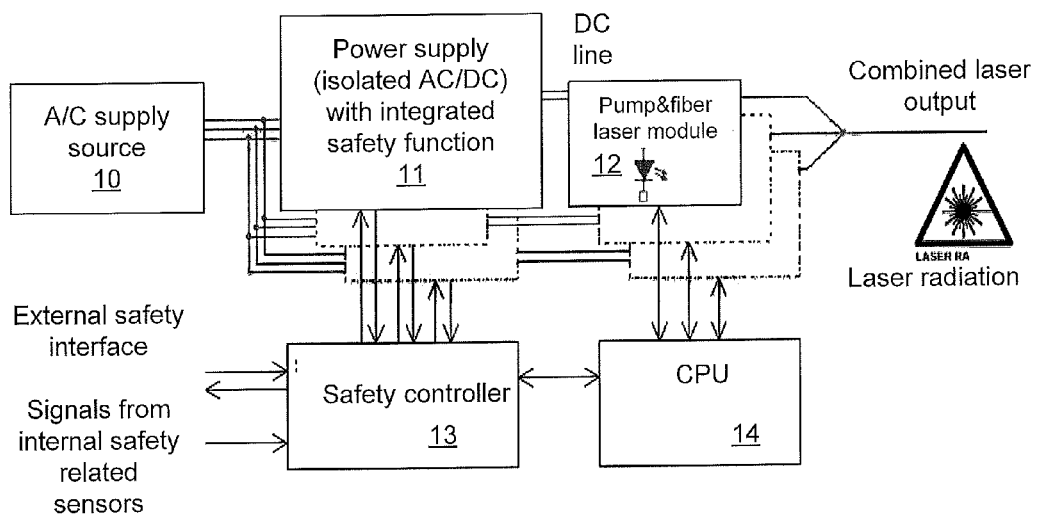
FIG. 4 shows a general view of the inventive safety system.

FIG. 4 shows a general view of the proposed novel concept. The power supply unit 11, whose operation will be examined below, is directly connected to power grid (AC supply source) 10. Depending on the required power of the laser system, the number of power supply units and pumping and fiber laser modules 12 can be changed. The system has a safety controller 13 which, on one hand, receives commands from outside requiring bringing the system to a safe state and also from internal sensors requiring emergency shutdown of the laser. On the other hand, safety controller 13 controls the power supply units 11, in which a safe shutdown and output discharge mechanism is specially built. A CPU 14, which is also incorporated in the system, controls the operation of the laser, such as the emission power, without interfering with the operation of the safety system. However, it can receive diagnostic information from the safety controller 13.

As was shown in the examples in FIG. 2 and FIG. 3, in order to bring the laser to a safe state, it is enough to ensure that the power supply voltage at the input of the pumping module 12 does not exceed the SOV. From the point of view of the arrangement of the power supply unit, it is possible to fulfill this condition if energy transmission from the primary circuit to the secondary is stopped, and all output capacitances of the power supply unit 11 (and also the input capacitances of pumping modules 12 connected in parallel to them) are discharged.

Figure 5:
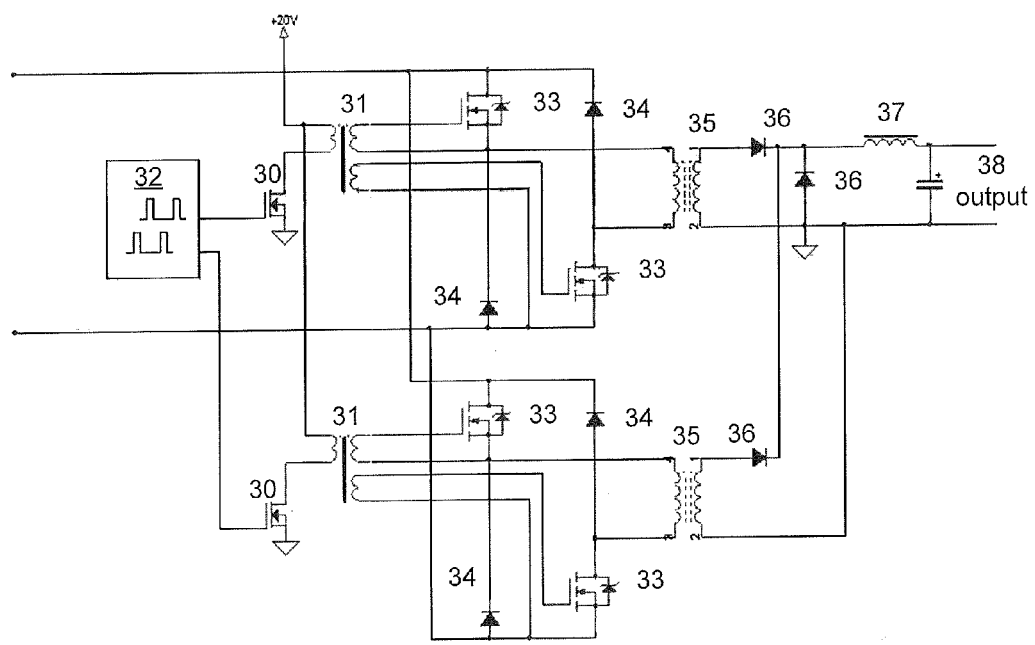
FIG. 5 shows the structural diagram of the DC-DC converter of the disclosed power supply module.

FIG. 5 shows the structural diagram of the DC-DC part of power supply unit 11. The shown circuitry is a variant of the dual forward converter known as interleaved two transistor forward converter. Drive pulses from the PWM controller 32 are amplified to the necessary level by switches 30 and enter gate-drive transformers 31. The output windings of the latter are connected to power switches 33, which switch the current in power transformers 35. Since the drive pulses from the controller 32 are out of phase relative to each other by 180 degrees and the duty cycle of the pulses in each channel does not exceed 50%, it is reasonable to connect this converter to a common rectifier on elements 36 and to a smoothing filter on elements 37 and 38. The frequency of the drive pulses is several tens or even hundreds of kilohertz, which ensures the relative compactness of the whole power source.

One of the salient features of the disclosed system relates to the safety of energy transmission from a primary circuit to a secondary is inherent in any galvanically isolated converter (transformer). In accordance with this feature it is impossible to transmit energy from a primary circuit to a secondary without drive pulses from a controller 32, regardless of whether or not elements 30, 31, 33, 34 operate or not. In other words, any single fault by elements 30, 31, 33, 34 cannot lead to a spontaneous energy transmission if there were no drive pulses from the controller 32. This important property should be examined from the point of view of safety standard requirements, where any single failure in the safety system must not lead to danger state.

Thus, in order to carry out the safety function described above, it is enough to ensure the absence of drive pulses from the controller 32 and to discharge the converter output to a safe SOV level (examined below). This makes it possible not to monitor the integrity of elements 30, 31, 33, 34. It should be noted that what is stated above is correct not only for the disclosed forward converter, but also for any other converter that has in the energy transmission path galvanic isolation in the form of a transformer, such as a Half-Bridge, Full-Bridge, Flyback, Push-Pull etc.

Figure 6:
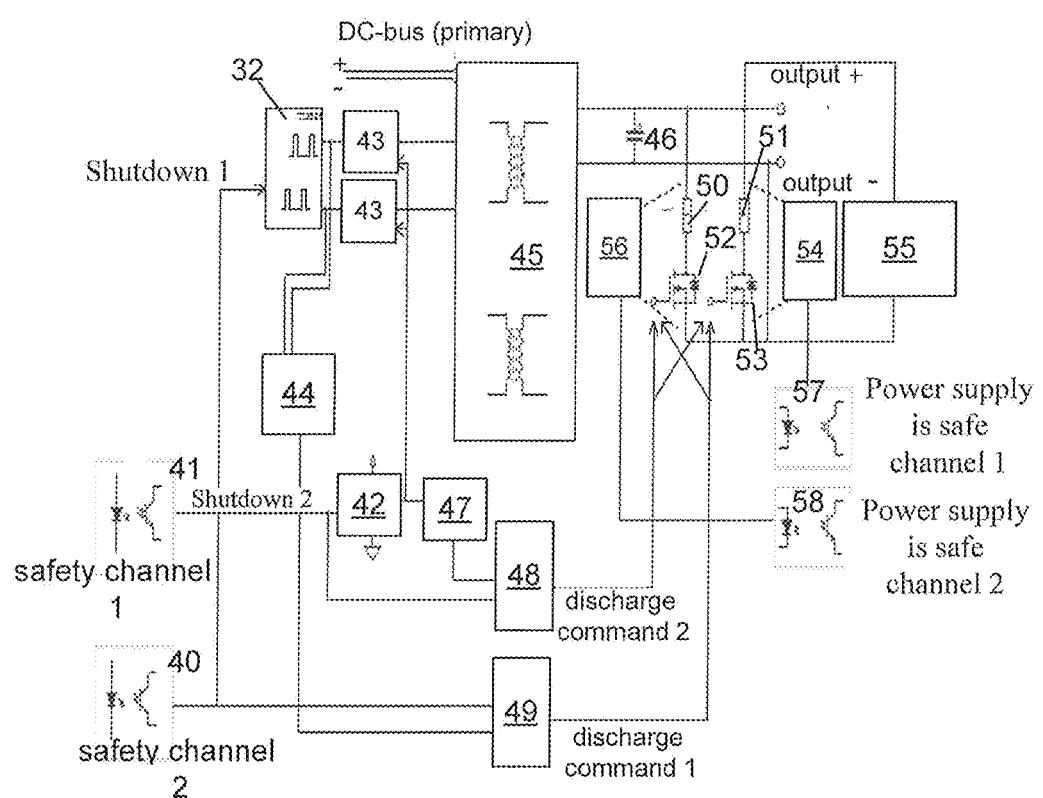
FIG. 6 shows the principle of the disclosed two-channel shutdown of the DC-DC converter and two-channel discharge of the power supply module's output capacitance.

FIG. 6 shows the principle of a two-channel shutdown of the converter and a two-channel discharge of the output capacitance. To comply with safety requirements, the shutdown and discharge scheme is carried out by two-channels, which is typical for Cat. 3 ISO13849-1 structures.

Both channels work independently of each other and are capable of bringing the laser to a safe state even in case of any single fault in the scheme. Input optocouplers 40, 41 receive commands from the safety controller 13 of FIG. 4. The absence of a signal means the command to turn off the power supply unit (de-energization principle). The signal from the optocoupler 40 (channel 1) comes to the dedicated shutdown input of the PWM controller 32 and can thereby shut it down.

A device 44 or watchdog monitors the presence/absence of pulses at the output of the controller 32 and, in fact, controls the integrity of the operation of shutdown channel 1. If the command to shut down the power supply unit comes through channel 1 and watchdog 44 confirms the absence of pulses at the output of the controller 32, then logic element "AND" 49 passes the discharge command of channel 1 further to the discharge unit. Shutdown channel 2 works by a similar principle. Two additional Mosfet drivers 43 are located at the output of the controller 32, and power to these is supplied from another Mosfet driver 42, which, in turn, is controlled by ON/OFF command from optocoupler 41.

The device in the form of comparator 47 monitors the presence/absence of power supply voltage on drivers 43 and, in fact, it controls the operational integrity of shutdown channel 2. If a command came through channel 2 to shut down the power supply unit and, at the same time, comparator 47 confirmed the absence of power supply at drivers 43, then logic element "AND" 48 would pass the discharge command of channel 2 further to the discharge unit. The center of FIG. 6 shows a DC-DC converter 45, which can be provided according to the scheme of FIG. 5 or any other converter having a transformer.

The discharge unit of output capacitance 46 is provided according to the two-channel scheme with the use of discharge resistors 50, 51 and switches 52, 53, which connect resistors 50, 51 to the power supply unit output. When there is at least one command from either of the two shutdown channels, both discharge channels engage. The discharge channels each may discharge the output capacitor after the DC converter is switched to the safe regime or, alternatively, simultaneously therewith. Devices 54, 56, for monitoring the integrity of operation of the discharge channels, can control such parameters as:

the presence of discharge current at the time of the discharge command until the output voltage drops below the SOV;

the absence of a discharge current with the absence of a discharge command; and the level of output voltage.

Monitoring units 44, 47, 54, 56 can control other parameters in order to detect faults in the safety circuits with the aim of increasing Diagnostic Coverage (DC) and thus the Performance Level (PL) of the entire system as a whole (both terms are used in the sense of the ISO 13849-1 standard).

Usually, the power supply unit has an auxiliary housekeeping power supply of low power for internal needs. To make sure that a malfunction of this source would not lead to the loss of the safety function, there is one or more reserve power sources 55 for internal needs. This source 55 is fed from the output of the power supply unit and is operational until the level of the output voltage of the power source is reduced to the SOV value. Thus, the safety function is ensured even in the absence of any external power supply.

The output optocouplers 57, 58 convey (high level) to the safety controller 13 the fact that the power supply unit is in a safe state if the voltage on its output is below the SOV value and in addition no faults have been recorded by monitoring units 44, 47, 54, 56.

Safety controller 13 shown in FIG. 4 can have its own monitoring functions. For example, it can make a cross-comparison of the signals from the outputs of the optocouplers 57, 58. Also, it can control the discharge time by measuring the delay value between the shutdown commands arriving at the input optocouplers 40, 41 and confirming a safe state by those arriving from output optocouplers 57, 58. If errors are detected in the operation of the safety system of one power supply unit 11, it can forcedly bring to a safe state the remaining power supply units 11 of the laser system. The measures enumerated above are intended to further increase the Performance Level (PL) of the safety system.

The disclosed safety system provides considerable practical advantages. For example, laser welding guns disclosed in WO2014063151 and WO 2014063153 and co-owned with the present application, are configured with laser sources. In the disclosed guns, the laser safety is realized by means of complex and high cost electro-optical switches. Typically, an optical switch is located along a light path downstream from a laser. As any mechanical device, it has a relatively long time response, which considerably increases the risk of exposure to kW-MW laser outputs. Furthermore, these laser sources require a dump means which may include additional fiber and safety space structure both of which are undesirable. The use of the presently disclosed safety system eliminates the need for switches and dump means. In another example, imagine a multi-laser system having multiple laser sources which operate in a sequential manner at respective wavelengths different from one another. Usually, one or multiple beam switches providing selective use of these sources are implemented with all the disadvantages discussed above. Replacing the beam switch or switches with laser sources which each are configured in accordance with the present invention clearly increases the safety and effectiveness of the multi-laser system.

Although the present disclosure has been described in terms of the disclosed example, numerous modifications and/or additions to the above-disclosed embodiments would be readily apparent to one skilled in the laser arts without departing however from the scope and spirit of the following claims.

The invention claimed is:

1. A laser safety control system, comprising:
   a power source module coupled to an AC source and including
      a galvanically isolated DC/DC converter, and
      a safety mechanism which is configured with first and second safety channels operating independently from one another and each provided with:
         a shutdown circuit for switching the power source module from a normal operating regime, in which a DC output of the power source has a high voltage, to a safe regime, in which the DC output has a low voltage lower than the high voltage, and
         a discharging circuit operative to discharge an output capacitor coupled to an output of the DC/DC converter to the low voltage in the safe regime;
   a laser module including a high power fiber laser system and a laser pump system which receives the DC output, wherein the low voltage is lower than an emission threshold of the laser pump system; and
   a safety controller configured to control an operation of the power source module in response to external signals from respective external and internal safety-related sensors, the safety controller generating enabling signals coupled into respective the first and second safety channels so as to enable the power source module in the normal operating regime when all of the external and internal sensors do not output respective external signals, and
   the safety controller removing the enabling signals in response to the external signals of at least one of the internal and external sensors, either of the two safety channels being operative to switch the normal operating regime of the power source module to the safety regime and discharge the output capacitor in the absence of the enabling signals.

2. The laser safety control system of claim 1 further comprising one or more additional power source modules.

3. The laser safety control system of claim 1 further comprising an auxiliary power source coupled to the output capacitor and operative to realize the safety regime if the power supply module is deenergized.

4. A laser safety control system, comprising:
   a power source module coupled to an AC source and including
      a galvanically isolated DC/DC converter, and
      a safety mechanism which is configured with first and second safety channels operating independently from one another and each provided with:
         a shutdown circuit for switching the power source module from a normal operating regime, in which a DC output of the power source has a high voltage, to a safe regime, in which the DC output has a low voltage lower than the high voltage, and
         a discharging circuit operative to discharge an output capacitor coupled to an output of the DC/DC converter to the low voltage in the safe regime; wherein the discharging circuits of respective safety channels each operate subsequently to or simultaneously with the shutdown circuit; and
   a laser module including a high power fiber laser system and a laser pump system which receives the DC output, wherein the low voltage is lower than an emission threshold of the laser pump system.

5. A laser safety control system, comprising:
   a power source module coupled to an AC source and including
      a galvanically isolated DC/DC converter, and
      a safety mechanism which is configured with first and second safety channels operating independently from one another and each provided with:
         a shutdown circuit for switching the power source module from a normal operating regime, in which a DC output of the power source has a high voltage, to a safe regime, in which the DC output has a low voltage lower than the high voltage,
         a discharging circuit operative to discharge an output capacitor coupled to an output of the DC/DC converter to the low voltage in the safe regime, and
         a plurality of multiple sensors monitoring integrity of executive components; and
   a laser module including a high power fiber laser system and a laser pump system which receives the DC output, wherein the low voltage is lower than an emission threshold of the laser pump system.

6. The laser safety control system of claim 5, wherein the first and second safety channels each further includes a plurality of output components operative to provide respective inputs into the safety controller when the power source module is in the safe regime, and the executive components are properly functioning.

* * * * *